United States Patent
Tsai et al.

(10) Patent No.: US 9,525,085 B2
(45) Date of Patent: Dec. 20, 2016

(54) BISMUTH FERRITE THIN-FILM SOLAR CELL AND METHOD OF MANUFACTURING THE SAME

(71) Applicant: NATIONAL CHUNG SHAN INSTITUTE OF SCIENCE AND TECHNOLOGY, Longtan Township (TW)

(72) Inventors: Yueh-Hsuan Tsai, Longtan Township (TW); Chao-Nan Wei, Longtan Township (TW); Hui-Yun Bor, Longtan Township (TW); Chia-Shih Lin, Longtan Township (TW); Cuo-Yo Nieh, Longtan Township (TW); Jenn-Ming Wu, Hsinchu (TW)

(73) Assignee: NATIONAL CHUNG SHAN INSTITUTE OF SCIENCE AND TECHNOLOGY (TW)

( * ) Notice: Subject to any disclaimer, the term of this patent is extended or adjusted under 35 U.S.C. 154(b) by 31 days.

(21) Appl. No.: 14/573,312

(22) Filed: Dec. 17, 2014

(65) Prior Publication Data

US 2016/0181451 A1 Jun. 23, 2016

(51) Int. Cl.
*H01L 31/00* (2006.01)
*H01L 31/032* (2006.01)
*H01L 31/0445* (2014.01)
*H01L 31/18* (2006.01)
*C23C 18/00* (2006.01)

(52) U.S. Cl.
CPC ............. *H01L 31/032* (2013.01); *C23C 18/00* (2013.01); *H01L 31/0445* (2014.12); *H01L 31/1884* (2013.01)

(58) Field of Classification Search
CPC ............. H01L 31/032; H01L 31/0445; H01L 31/1884; C23C 14/08; C23C 14/35; C23C 18/00
USPC .................................................. 136/261, 265
See application file for complete search history.

(56) References Cited

U.S. PATENT DOCUMENTS

| | | | |
|---|---|---|---|
| 8,907,205 B2* | 12/2014 | Nechache | H01L 31/032 136/254 |
| 2009/0229653 A1* | 9/2009 | Lu | H01L 31/02242 136/249 |
| 2011/0308580 A1* | 12/2011 | Seidel | B82Y 10/00 136/252 |

OTHER PUBLICATIONS

Zang, Yongyuan, et al., "Enhanced photovoltaic properties in graphene/polycrystalline BiFeO3/Pt heterojunction structure", Applied Physics Letters 99, 132904 (2011), pp. 1-3.*
Liu, Jian, et al., "Influence of Zn doping on structural, optical and magnetic properties of BiFeO3 films fabricated by the sol-gel technique", Materials Letters 133, Jun. 28, 2014, pp. 49-52.*

* cited by examiner

*Primary Examiner* — Tamir Ayad
(74) *Attorney, Agent, or Firm* — Schmeiser, Olsen & Watts, LLP

(57) ABSTRACT

A bismuth ferrite thin-film solar cell and a method of manufacturing the same control the quantity of $Fe^{2+}$ defected in the bismuth ferrite thin-film by doping with zinc. Reduction of the quantity of $Fe^{2+}$ defects in the bismuth ferrite thin-film is conducive to the increase of closed-circuit current density and enhancement of photoelectric conversion efficiency.

4 Claims, 2 Drawing Sheets

BISMUTH FERRITE THIN-FILM SOLAR CELL AND METHOD OF MANUFACTURING THE SAME

FIELD OF TECHNOLOGY

The present invention relates to methods of manufacturing thin-film solar cells, and more particularly, to a method of manufacturing a bismuth ferrite thin-film solar cell, characterized in that the quantity of $Fe^{2+}$ defects of the thin-film per se is reduced by the doping of an appropriate element.

BACKGROUND

A conventional ferroelectric thin-film solar cell is characterized in that its active layer is formed from a thin-film which is made of a single ferroelectric material, such that a built-in electrical field contributed by a ferroelectric domain wall is conducive to separation of carriers when irradiated. Although the electrical field of a ferroelectric material domain wall is stronger than the electrical field of the p-n depletion region in a conventional silicon-based solar cell, an overly low closed-circuit current density places a limit on the application of a ferroelectric material in the photovoltaic field.

Bismuth ferrite is a ferroelectric material which features an energy gap of 2.3~2.8 eV and thus falls into the frequency range of visible light. Compared with the other ferroelectric materials with energy gaps which fall outside the frequency range of ultraviolet (UV), bismuth ferrite is suitable for use in manufacturing a ferroelectric thin-film solar cell. Basically, bismuth ferrite also features oxygen vacancies and $Fe^{2+}$ defects and thus functions as a carrier capturing center whereby carriers are captured when separated by irradiation, thereby enhancing the chance of recombination. To enhance photoelectric conversion efficiency, it is feasible to change the defect concentration, the quantum conversion efficiency, and the energy gap of a ferroelectric material by element doping. However, not all types of element doping can enhance the photoelectric conversion efficiency, because the type, proportion, and preparation process of the doping element affect the current density and the photoelectric conversion efficiency of the finished products of thin-film solar cells.

SUMMARY

In view of the aforesaid drawbacks of the prior art, it is an objective of the present invention to provide a bismuth ferrite thin-film solar cell and a method of manufacturing the same, characterized in that the quantity of $Fe^{2+}$ defects in the bismuth ferrite thin-film is controlled by zinc doping. The reduction of the quantity of $Fe^{2+}$ defects in the bismuth ferrite thin-film is conducive to the increase of closed-circuit current density and enhancement of photoelectric conversion efficiency.

The present invention provides a bismuth ferrite thin-film solar cell, comprising: a substrate disposed below a platinum lower electrode layer; a bismuth ferrite thin-film layer disposed on the platinum lower electrode layer; and a transparent conductive thin-film layer disposed on the bismuth ferrite thin-film layer, wherein the bismuth ferrite thin-film is doped by zinc, and a chemical formula of the bismuth ferrite is $(Bi_{1-x}Zn_x)FeO_{3-0.5x}$, where x is no larger than 0.1. The substrate is made of silicon. The transparent conductive thin-film is made of gallium zinc oxide or indium tin oxide.

The present invention provides a method of manufacturing a bismuth ferrite thin-film solar cell, comprising the steps of: providing a substrate disposed below a platinum lower electrode layer; providing a bismuth ferrite solution and plating the bismuth ferrite solution onto the substrate to form a bismuth ferrite thin-film; and plating a transparent conductive thin-film onto the bismuth ferrite thin-film to form a bismuth ferrite thin-film solar cell, wherein the bismuth ferrite solution is doped by zinc, and a chemical formula of the bismuth ferrite is $(Bi_{1-x}Zn_x)FeO_{3-0.5x}$, where x is no larger than 0.1. The substrate is made of silicon. The transparent conductive thin-film is made of gallium zinc oxide or indium tin oxide.

The present invention provides a bismuth ferrite thin-film solar cell and a method of manufacturing the same to reduce the quantity of $Fe^{2+}$ defects in the bismuth ferrite thin-film by doping with zinc. The present invention discloses a bismuth ferrite thin-film and a bismuth ferrite solution with the chemical formula $(Bi_{1-x}Zn_x)FeO_{3-0.5x}$, where x denotes the proportion of zinc doped and is no greater than 0.1. That is to say, the proportion of zinc doped is expressed by 0-10 at. % (at. % denotes atomic percentage. Given a zinc doped proportion of 5 at. % (x=0.05), the bismuth ferrite thin-film solar cell of the present invention has the optimal performance.

The above overview and the following description and drawings are intended to further explain the means and measures taken to achieve the predetermined objective of the present invention and the effects of the present invention. The other objectives and advantages of the present invention are described below and illustrated with drawings.

BRIEF DESCRIPTION

DETAILED DESCRIPTION

The implementation of the present invention is hereunder illustrated with specific embodiments, so that persons skilled in the art can easily gain insight into the other advantages and effects of the present invention by referring to the disclosure contained in this specification.

Figure 1:
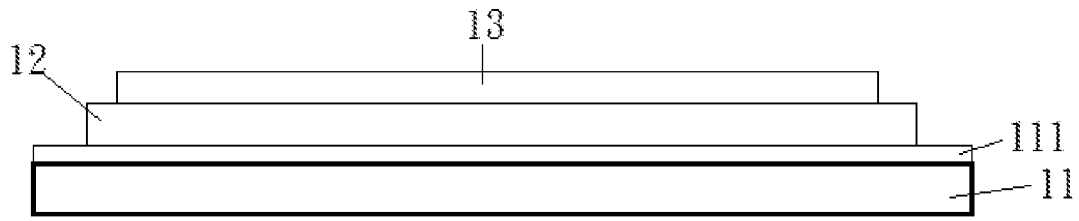
FIG. 1 is a schematic view of the structure of a bismuth ferrite thin-film solar cell of the present invention.

Referring to FIG. 1, there is shown a schematic view of the structure of a bismuth ferrite thin-film solar cell of the present invention. As shown in the diagram, the bismuth ferrite thin-film solar cell comprises: a substrate 11, wherein the substrate 11 is disposed below a platinum lower electrode layer 111; a bismuth ferrite thin-film layer 12 disposed on the platinum lower electrode layer 111; and a transparent conductive thin-film layer 13 disposed on the bismuth ferrite thin-film layer 12, wherein the bismuth ferrite thin-film is doped by zinc, and the chemical formula of the bismuth ferrite thin-film 12 is $(Bi_{1-x}Zn_x)FeO_{3-0.5x}$, where x is no larger than 0.1. The substrate is made of silicon. The transparent conductive thin-film is made of gallium zinc oxide or indium tin oxide.

Figure 2:
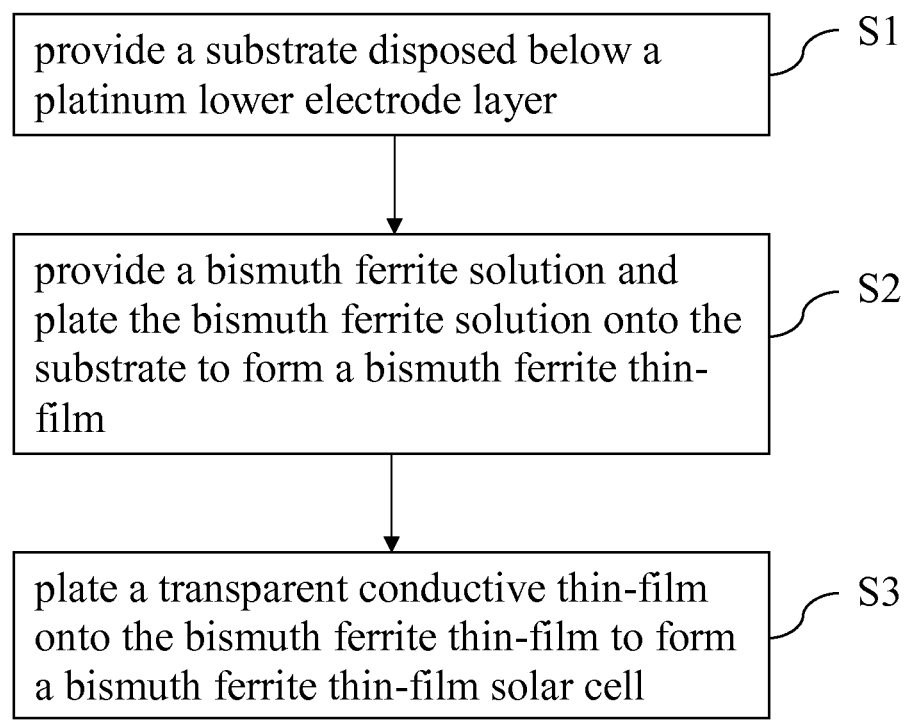
FIG. 2 is a schematic view of the process flow of a method of manufacturing a bismuth ferrite thin-film solar cell according to the present invention.

Referring to FIG. 2, there is shown a schematic view of the process flow of a method of manufacturing a bismuth ferrite thin-film solar cell according to the present invention. As shown in the diagram, the method comprises the steps of: S1 providing a substrate, wherein a platinum lower electrode layer is disposed on the substrate; S2 providing a bismuth ferrite solution and plating the bismuth ferrite solution onto the substrate to form a bismuth ferrite thin-film; and S3 plating a transparent conductive thin-film onto the bismuth ferrite thin-film to form a bismuth ferrite thin-film solar cell, wherein the bismuth ferrite solution is doped by zinc, and the chemical formula of the bismuth ferrite is $(Bi_{1-x}Zn_x)FeO_{3-0.5x}$, where x is no larger than 0.1. The substrate is made of silicon. The transparent conductive thin-film is made of gallium zinc oxide or indium tin oxide.

The present invention involves using a sol-gel method or a radio frequency magnetron sputtering technique in plating a zinc-doped bismuth ferrite solution onto a substrate whose lower electrode is formed in advance by platinum plating, and then the substrate undergoes an annealing process to thereby finalize the manufacturing process of the bismuth ferrite thin-film. In an embodiment of the present invention, the process flow of preparing the bismuth ferrite solution is as follows: dehydrating mixed solutions of zinc acetate, propanoic acid, and dimethoxy ethanol at 110° C. for 1 hour, introducing bismuth acetate to the dehydrated solution, keeping the bismuth acetate-containing dehydrated solution at 110° C. for 30 minutes, introducing ferric acetylacetonate to the bismuth acetate-containing dehydrated solution, keeping the ferric acetylacetonate-containing bismuth acetate-containing dehydrated solution at 110° C. for 30 minutes, cooling the ferric acetylacetonate-containing bismuth acetate-containing dehydrated solution down to 80° C., and reflowing the cooled ferric acetylacetonate-containing bismuth acetate-containing dehydrated solution for 2 hours, thereby producing a zinc-doped bismuth ferrite solution.

The present invention provides a bismuth ferrite thin-film solar cell and a method of manufacturing the same to reduce the quantity of $Fe^{2+}$ defects in the bismuth ferrite thin-film by doping with zinc. Reduction of the quantity of $Fe^{2+}$ defects in the bismuth ferrite thin-film is conducive to the increase of closed-circuit current density and enhancement of photoelectric conversion efficiency. The bismuth ferrite thin-film solar cell of the present invention has a GZO/BZFO/Pt or ITO/BZFO/Pt structure, wherein GZO denotes a transparent conductive thin-film made of oxidized gallium zinc or gallium zinc oxide, ITO denotes a transparent conductive thin-film made of oxidized indium tin or indium tin oxide, and BZFO denotes a zinc-doped bismuth ferrite thin-film, wherein Pt denotes platinum.

Figure 3:
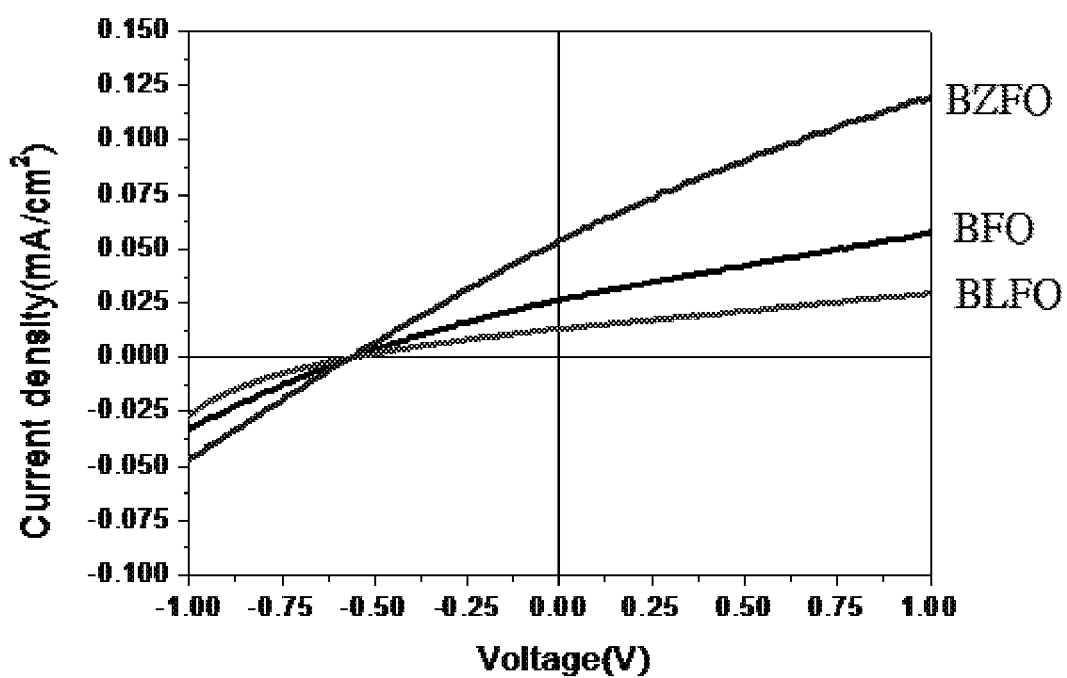
FIG. 3 are graphs of current density against voltage according to the present invention and the prior art.

Referring to FIG. 3, there are shown graphs of current density against voltage according to the present invention and the prior art. As shown in the diagram, the present invention discloses open-circuit voltage of a zinc-doped bismuth ferrite thin-film (BZFO), which substantially equals that of undoped bismuth ferrite thin-film (BFO) and lanthanum-doped bismuth ferrite thin-film (BLFO). According to the present invention, the closed-circuit current density of BZFO is larger than that of BFO and BLFO. An increase in the closed-circuit current implies enhancement of the photoelectric conversion efficiency; hence, the zinc-doped bismuth ferrite thin-film of the present invention does enhance the efficiency of operation of the bismuth ferrite solar cell.

The present invention is disclosed above by preferred embodiments. However, persons skilled in the art should understand that the preferred embodiments are illustrative of the present invention only, but should not be interpreted as restrictive of the scope of the present invention. Hence, modifications and variations can be made by persons skilled in the art to the aforesaid embodiments without departing from the spirit and scope of the present invention and still fall within the scope of the present invention. Accordingly, the legal protection for the present invention should be defined by the appended claims.

What is claimed is:

1. A method of manufacturing a bismuth ferrite thin-film solar cell, comprising the steps of:
   providing a substrate disposed below a platinum lower electrode layer;
   providing a bismuth ferrite solution and plating the bismuth ferrite solution onto the substrate to form a bismuth ferrite thin-film; and
   plating a transparent conductive thin-film onto the bismuth ferrite thin-film to form a bismuth ferrite thin-film solar cell,
   wherein the bismuth ferrite solution is doped by zinc, and a chemical formula of the bismuth ferrite is $(Bi_{1-x}Zn_x)FeO_{3-0.5x}$;
   wherein the bismuth ferrite solution is prepared by dehydrating mixed solutions of zinc acetate, propanoic acid, and dimethoxy ethanol at 110° C. for 1 hour, introducing bismuth acetate to the dehydrated solution, keeping the bismuth acetate-containing dehydrated solution at 110° C. for 30 minutes, introducing ferric acetylacetonate to the bismuth acetate-containing dehydrated solution, keeping the ferric acetylacetonate-containing bismuth acetate-containing dehydrated solution at 110° C. for 30 minutes, cooling the ferric acetylacetonate-containing bismuth acetate-containing dehydrated solution down to 80° C., and reflowing the cooled ferric acetylacetonate-containing bismuth acetate-containing dehydrated solution for 2 hours, thereby producing a zinc-doped bismuth ferrite solution.

2. The method of claim 1, wherein the x is no larger than 0.1.

3. The method of claim 1, wherein the transparent conductive thin-film layer is made of gallium zinc oxide.

4. The method of claim 1, wherein the transparent conductive thin-film layer is made of indium tin oxide.

* * * * *